United States Patent [19]

Egawa

[11] Patent Number: 4,560,216
[45] Date of Patent: Dec. 24, 1985

[54] CONNECTOR WITH COMPONENT REMOVAL MEANS

[75] Inventor: Yoshinori Egawa, Tokyo, Japan

[73] Assignee: Yamaichi Electric Mfg. Co., Ltd., Tokyo, Japan

[21] Appl. No.: 548,137

[22] Filed: Nov. 2, 1983

[30] Foreign Application Priority Data

Mar. 22, 1983 [JP] Japan .............................. 58-40953[U]

[51] Int. Cl.[4] ........................ H05K 1/00; H01R 13/62
[52] U.S. Cl. ............................. 339/12 V; 339/17 CF; 339/45 M; 339/75 M; 324/158 F; 248/363
[58] Field of Search ................ 339/12 R, 12 V, 45 R, 339/45 M, 17 C, 17 CF, 75 M, 45 T, 75 MP; 248/206.1, 206.2, 206.3, 206.4, 363; 324/158 F

[56] References Cited

U.S. PATENT DOCUMENTS

| | | | |
|---|---|---|---|
| 2,175,941 | 10/1939 | Keays .............................. | 248/363 X |
| 2,936,139 | 5/1960 | Lindstrom ...................... | 248/363 X |
| 3,365,161 | 1/1968 | Deitch ............................ | 248/363 X |
| 3,391,383 | 7/1968 | Antes ........................... | 324/158 F X |
| 4,196,882 | 4/1980 | Rognon .......................... | 248/363 X |
| 4,460,223 | 7/1984 | Brown et al. ............. | 339/75 MP X |

FOREIGN PATENT DOCUMENTS

| | | | |
|---|---|---|---|
| 18338 | 1/1982 | Japan ............................. | 324/158 F |
| 2021334 | 11/1979 | United Kingdom .......... | 339/75 MP |

OTHER PUBLICATIONS

B. C. Abraham et al., "Automatic Wafer Transfer and Turnover Tool", *Western Electric Technical Digest*, No. 49, Jan. 1978, pp. 1-2.

*Primary Examiner*—Gil Weidenfeld
*Assistant Examiner*—Steven C. Bishop
*Attorney, Agent, or Firm*—Wenderoth, Lind & Ponack

[57] ABSTRACT

An IC socket with a mechanism for removing an IC package mounted therein and which has terminals to be brought into contact with terminals of the IC socket, the IC socket has a socket body with terminals around a package receiving recess to receive terminals of the IC package, a cover pivotally attached to the socket body and pivotable to a closed position, a lock for locking the cover, and a suction cup attached to the under side of the cover for snugly retaining the IC package in said recess in said socket body when the cover is locked and holding said IC package thereon by suction when the cover is opened relative to the IC socket body for removing the IC package from the socket body. A mounting stem on the suction cup extends through a bore in the cover and a flange on the end of the mounting stem seats in a flange receiving recess. A pressing portion projecting inwardly from the cover presses the terminals of the IC package firmly into contact with the terminals of the socket body when the cover is closed. The suction end of the suction cup projects slightly outwardly from the free end of the pressing portion, whereby the IC package held on the suction cup is spaced slightly from the pressing portion when the cover is opened.

4 Claims, 5 Drawing Figures

# CONNECTOR WITH COMPONENT REMOVAL MEANS

BACKGROUND OF THE INVENTION

1. Field of the Invention

The present invention relates to an IC socket having means fo removing an IC package placed on the IC socket.

2. Description of the Prior Art

A flat IC package is conventionally placed on an IC socket to allow terminals of the flat IC package to be superposed on and brought into contact with terminals of the IC socket and, in that state, to form an electric connection between the IC package and a printed board or apparatus through the medium of the IC socket.

Generaly, the IC socket is provided with a cover and a lock means for locking the cover for the purpose of retaining the IC package in its connected condition. The cover is pivotally attached to one end of the IC socket so that it can be opened and closed relative to the IC socket. The cover is closed onto the IC socket, the terminals of the connected component are pressed down by a pressing portion projecting in the shape of a pillow from the inner surface of the cover, and a lock lever is engaged with the free end of the cover. As a result, the cover is retained in the closed state and the IC package is retained on the IC socket.

When the IC package is to be removed from the IC socket, it is generally taken out of the IC socket with the fingers. The IC package, however, is usually a flat component, and since it has a few portions which can be grasped, it is difficult to rapidly extract the IC package from the IC socket. Careless extraction causes minute lead wires to be deformed or bent. When the IC socket is used for the purpose of inspecting the quality of IC packages, frequent extraction of the IC package is required. Therefore, simplification of the extracting process has been desired.

SUMMARY OF THE INVENTION

One object of the present invention is to provide a connector with a removing means, which allows the IC package to be easily removed from the IC socket.

To attain the object described above, according to the present invention, there is provided an IC socket with means for removing an IC package from the IC socket, the package having terminals to be brought into contact with terminals of an IC socket and which is removably mounted on the IC socket, the IC socket having a cover pivotally attached to one end of the IC socket a lock lever pivotally attached to the other end of the IC socket and adapted to engage the free end of the cover, and a suction member on the cover adapted to suctionally engage the IC package to make it easy to remove the IC package from the socket.

The aforementioned and other objects, characteristic features and advantages of the present invention will become apparent from the description of the invention given hereinbelow with reference to the accompanying drawings.

DESCRIPTION OF THE PREFERRED EMBODIMENT

Figure 1:
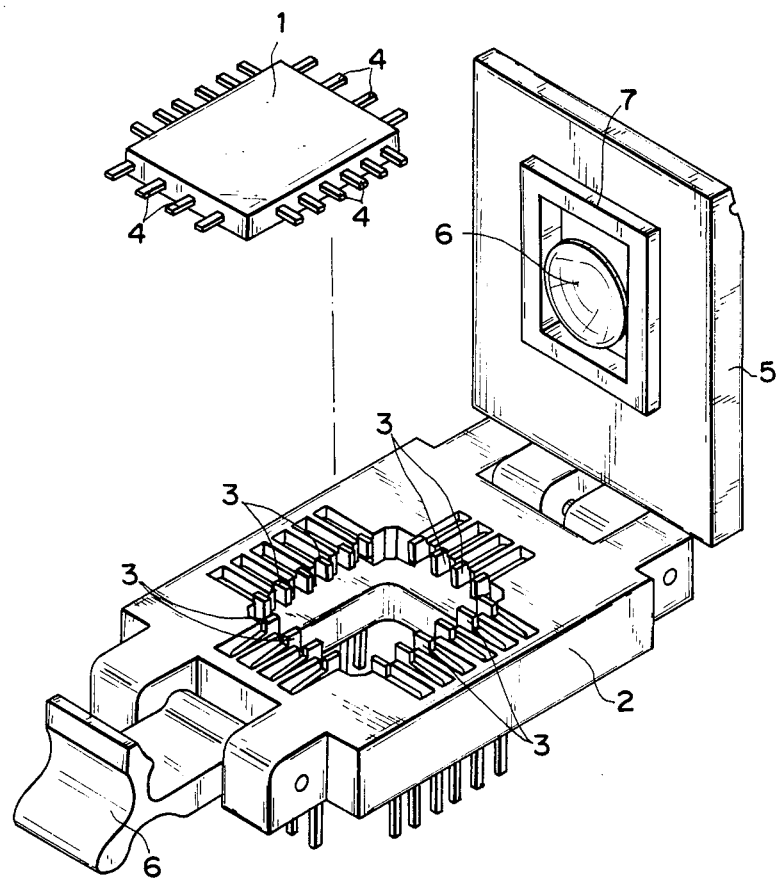
FIG. 1 is a perspective view showing one embodiment of the IC socket with the IC package removing means according to the present invention and also showing an IC package to be inserted into the IC socket.
Figure 2:
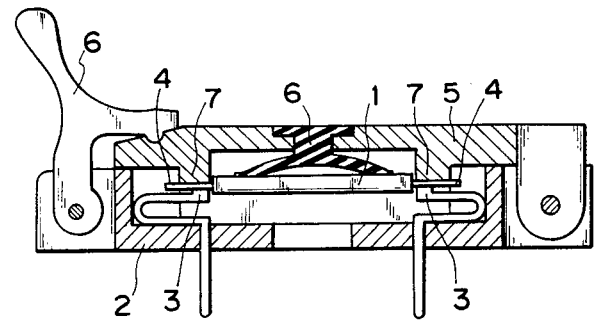
FIG. 2 is a cross-sectional view of the embodiment of FIG. 1 with the cover closed, showing the IC package mounted in the IC socket.
Figure 3:
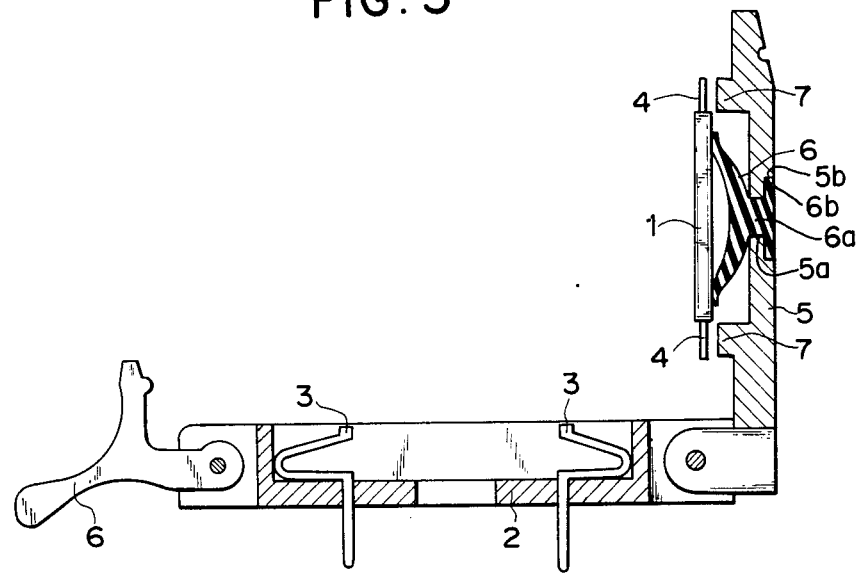
FIG. 3 is a cross-sectional view of the embodiment of FIG. 1 with the cover open, showing the IC package removed from the IC socket.

FIGS. 1 through 3 show one embodiment of the IC socket with the suction means for removing the IC package according to the present invention, in which a suction cup member 6 is used as the suction means and is attached to a cover 5 which is hingedly attached to one end of an IC socket body 2 so that it can be opened and closed.

The suction cup member 6 is firmly attached to the inner surface of the cover 5 by a mounting stem 6a extending through a mounting bore 5a in cover 5 and a flange 6b on the outer end of stem 6a snugly fitted in a flange receiving recess 5b, as illustrated, and suctionally engages an IC package 1 placed in the IC socket body 2 when the cover 5 has been closed relative to the IC socket body 2 as illustrated in FIG. 2. As illustrated in FIG. 3, when the cover 5 is opened, the suction means 6 remains suctionally engaged with the IC package 1 and pulls the IC package 1 out of the socket 2 and carries it along with the cover 5.

A pressing portion 7 is integrally formed with the pressing cover 5 and projects from the cover 5 in the direction toward the terminals 3 of the IC socket 2 and has a frame-like shape surrounding the suction cup member 6 in the illustrated embodiment. The suction cup member 6 is disposed inside the pressing portion 7 and has its suction end projected slightly outwardly of the free face of the pressing portion 7. With this arrangement, when the cover is closed, the suction cup member 6 suctionally engages the upper surface of the connected appliance 1 and then the pressing portion 7 presses the terminals 4 down into the terminals 3. When the lid is then opened, the suction cup member 6, after it has carried the IC package with it in the opening movement, holds the IC package away from the pressing member as shown in FIG. 3.

In this embodiment, the cover 5 is used as means for the attachment of the suction member 6. Optionally, a carrier member not having a pressing function but having opening and closing functions may be used as the suction cup member attaching means. In this case, suctional engagement with and pulling out of the IC package 1 can be effected by pivotally attaching the carrier member to the IC socket body 2, attaching the suction cup member 6 to the carrier member and effecting the closing and opening operations of the carrier member, and the suction cup member attached to the carrier member can serve also as a pressing member.

By providing the cover 5 of the IC socket with the suction member, as described above, it is possible to remove the IC package from the IC socket without difficulty and to avoid deformation etc. of the terminals brought about when the IC package has conventionally been extracted with the fingers by a worker. Further, since the suction cup member 6 is soft, the IC package can be extracted without being damaged. Particularly in a quality inspection work which requires frequent alternate attachment and detachment of IC packages, the IC socket of the present invention can allow the work to be efficiently effected and relieve workers of their fatigue. Further, the IC package 1 can be snugly fitted and stably mounted on the IC socket body 2 because it is pressed down by the suction cup member 6.

Figure 4:
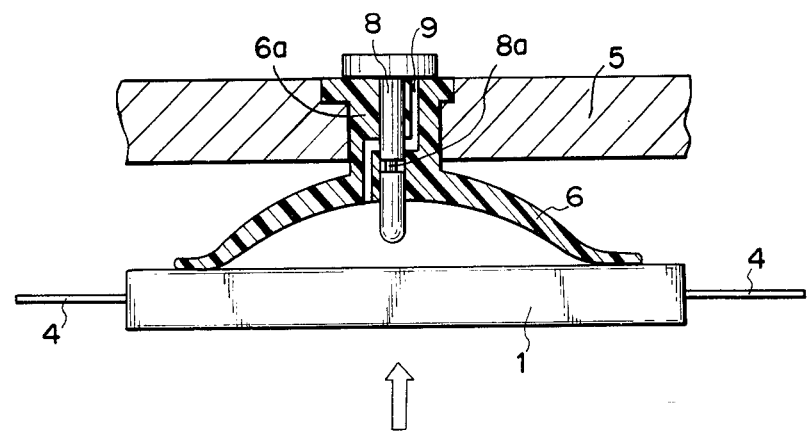
FIG. 4 is an enlarged cross-sectional view of one embodiment of means for breaking the suction of the suction member.
Figure 5:
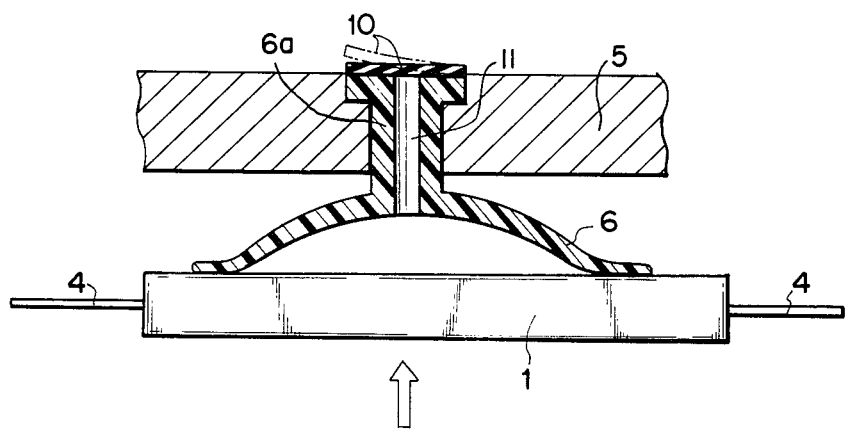
FIG. 5 is an enlarged cross-sectional view of another embodiment of means for breaking the suction of the suction member.

FIGS. 4 and 5 illustrate embodiments of the IC socket according to the present invention, in which there are provided means for releasing the suction force of the suction cup member 6 so as to make it easy to release the IC package 1 suctionally held on the suction cup member 6 from the suction cup member.

In the embodiment of FIG. 4, the suction cup member 6 is fixed to a carrier member having opening and closing functions such as the pressing cover 5 described above by inserting a resilient mounting stem portion 6a integral with and projection from the rear center of the suction cup member 6 into a hole in the carrier member and, at the same time, a pin valve 8 is inserted into the mounting stem portion 6a for sliding in and out of the stem portion 6a. Movement of the pin valve 8 out of the stem allows the outside air to be introduced into the suction cup member and inward movement of the pin valve 8 closes the inside of the suction cup member to keep it airtight. To be more specific, the mounting stem portion 6a has a bent 9 formed therein and the pin valve 8 has a peripheral groove 8a formed in the circumference thereof. The peripheral groove 8a of the pin valve 8 is positioned in the vent 9 of the fitting seat portion 6a by moving the pin valve 8 outwardly, the outside air is introduced into the suction cup member through the vent 9 to thereby release the suction force exerted on the IC package. Since the inner end of the pin valve extends into the inside of the suction cup member in this embodiment, pressing of the IC package in the direction of the arrow in FIG. 4 pushes the pin valve 8 upward to allow the inside of the suction cup member to communicate with the outside air, thereby releasing the suction force on the IC package.

FIG. 5 illustrates another embodiment of the suction force releasing means usable for the purpose of the present invention. In this embodiment, the end of the mounting stem portion 6a of the sucking member 6 has a flap 10 having its one side connected with the mounting stem portion 6, and the mounting portion has a vent bore 11 formed therein into the inside of the sucking member 6. When the suction cup member 6 is pushed down on the IC package, i.e. when the cover 5 is closed relative to the IC socket 2 having the IC package 1 therein, no suction force is exerted on the IC package 1 because the flap 10 is opened by the internal pressure. When the cover 5 is caused to start opening relative to the IC socket 2 to release the pressing force, negative pressure is generated within the suction cup member 6 and the flap 10 is closed to maintain the suction force. Further, when the IC package 1 held on the suction cup member 6 when the cover 5 is open is pressed in the direction of the arrow in FIG. 5, the internal pressure within the suction cup member is increased to open the flap 10. As a result, the inside of the suction cup member is communicated with the outside air and the flap 10 can then be blocked from closing, e.g. by the finger of a worker to thereby release the IC package 1.

As described above, according to the present invention, it is possible to stably connect an IC package firmly to an IC socket and to easily remove the IC package from the IC socket without damage to the IC package.

What is claimed is:

1. An IC socket with means for removing an IC package mounted therein and which has terminals to be brought into contact with terminals of the IC socket, said IC socket comprising:

a socket body having a recess therein for receiving the IC package and having terminals therearound with which the terminals of the IC package are engaged;

a cover pivotally attached to one end of said socket body pivotable to a closed position over said recess;

lock means pivotally attached to the other end of said socket body and engageable with the free end of said cover to hold said cover in the closed position;

a suction cup attached to the under side of said cover for snugly retaining the IC package in said recess in said socket body when said cover is locked and holding said IC package thereon by suction when said cover is opened relative to said IC socket body for removing the IC package from said socket body, said cover having a bore therethrough and a flange receiving recess around said bore on the outside of said cover, and said suction cup having a mounting stem thereon extending through said bore and a flange on the end of said mounting stem seated in said flange receiving recess, said cover having on its inside surface a pressing portion projecting inwardly toward the recess in said socket body for pressing the terminals of the IC package firmly into contact with the terminals of said socket body when said cover is closed, and said suction cup being inside said pressing portion and having the suction end projecting slightly outwardly from the free end of said pressing portion, whereby the IC package held on said suction cup is spaced slightly from said pressing portion when said cover is opened.

2. An IC socket as claimed in claim 1 wherein said suction cup has means for releasing the suction thereof.

3. An IC socket as claimed in claim 2 wherein said means for releasing the suction of said suction cup comprises a vent in said mounting stem, and a pin valve inserted into said mounting stem and movable in and out of said stem and having a peripheral groove therein for being moved into and out of alignment with said vent during movement of said pin.

4. An IC socket as claimed in claim 2 wherein said means for releasing the suction of said suction cup comprises a vent bore through said mounting stem and a flap valve on the outer end of said mounting stem over said vent bore.

* * * * *